United States Patent
Heerman et al.

(10) Patent No.: US 6,221,229 B1
(45) Date of Patent: Apr. 24, 2001

(54) METHOD FOR FORMING METAL CONDUCTOR PATTERNS ON ELECTRICALLY INSULATING SUBSTRATES AND SUPPORTS

(75) Inventors: Marcel Heerman, Merelbeke; Hubert de Steur, Drongen, both of (BE)

(73) Assignee: Siemens S.A., Brussels (BE)

( * ) Notice: Subject to any disclaimer, the term of this patent is extended or adjusted under 35 U.S.C. 154(b) by 0 days.

(21) Appl. No.: 09/380,862
(22) PCT Filed: Mar. 3, 1998
(86) PCT No.: PCT/EP98/01188
  § 371 Date: Sep. 9, 1999
  § 102(e) Date: Sep. 9, 1999
(87) PCT Pub. No.: WO98/41070
  PCT Pub. Date: Sep. 17, 1998

(30) Foreign Application Priority Data

Mar. 11, 1997 (DE) .............................. 197 09 954

(51) Int. Cl.⁷ ................................... H05K 3/00
(52) U.S. Cl. .................. 205/125; 205/118; 205/122; 205/123; 205/126
(58) Field of Search ..................... 205/123, 125, 205/126, 118, 122

(56) References Cited

U.S. PATENT DOCUMENTS

| | | |
|---|---|---|
| 4,289,575 | 9/1981 | Matsumoto et al. . |
| 4,608,274 | 8/1986 | Wooten . |
| 4,804,615 | 2/1989 | Larson et al. . |
| 5,929,516 * | 7/1999 | Heerman et al. ............ 257/701 |

FOREIGN PATENT DOCUMENTS

| | | |
|---|---|---|
| 0 452 506 | 10/1991 | (EP) . |
| 0 517 399 | 12/1992 | (EP) . |
| 0 641 152 | 3/1995 | (EP) . |
| WO 95/29573 | 11/1995 | (WO) . |
| WO 96/09646 | 3/1996 | (WO) . |

OTHER PUBLICATIONS

Abstract of Japanese 08–148809, *Patent Abstracts of Japan*, vol. 96, No. 10, Oct. 31, 1990.

Abstract of Japanese 08–167769, *Patent Abstracts of Japan*, vol. 96, No. 10, Oct. 31, 1996.

* cited by examiner

*Primary Examiner*—Kathryn Gorgos
*Assistant Examiner*—Christopher M Keehan
(74) *Attorney, Agent, or Firm*—Schiff Hardin & Waite

(57) ABSTRACT

In order to form metallic conductor patterns having connection regions that can be soldered and/or bonded on electrically insulating substrates, firstly a metalization is applied to the substrate and is then removed again, at least in those regions adjoining the desired conductor pattern. There then follows the electrolytic deposition of a final surface which can be soldered and/or bonded to the connection regions. Clean-room conditions are not necessary.

20 Claims, 5 Drawing Sheets

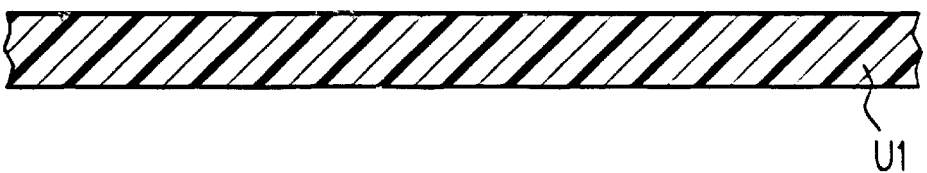
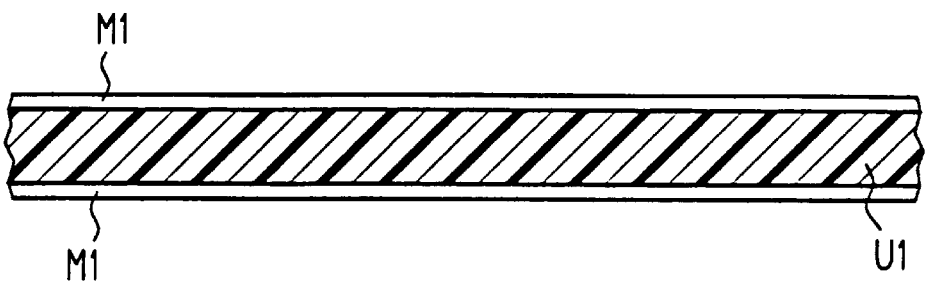
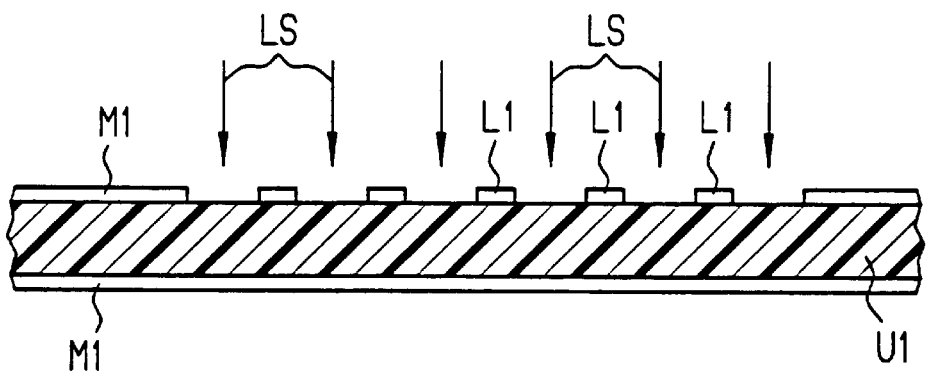
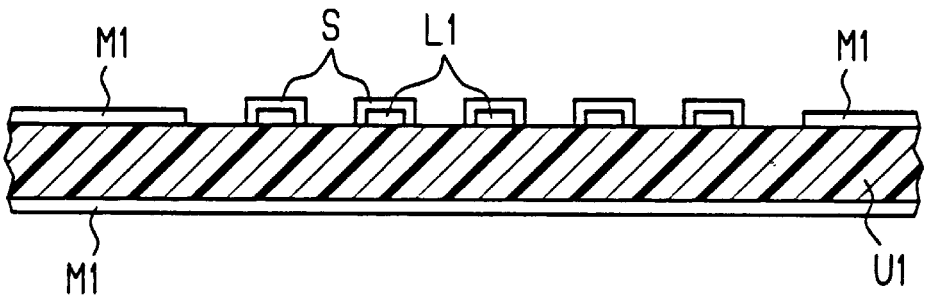

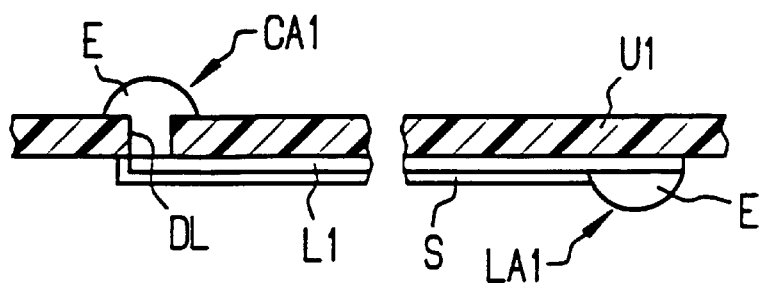
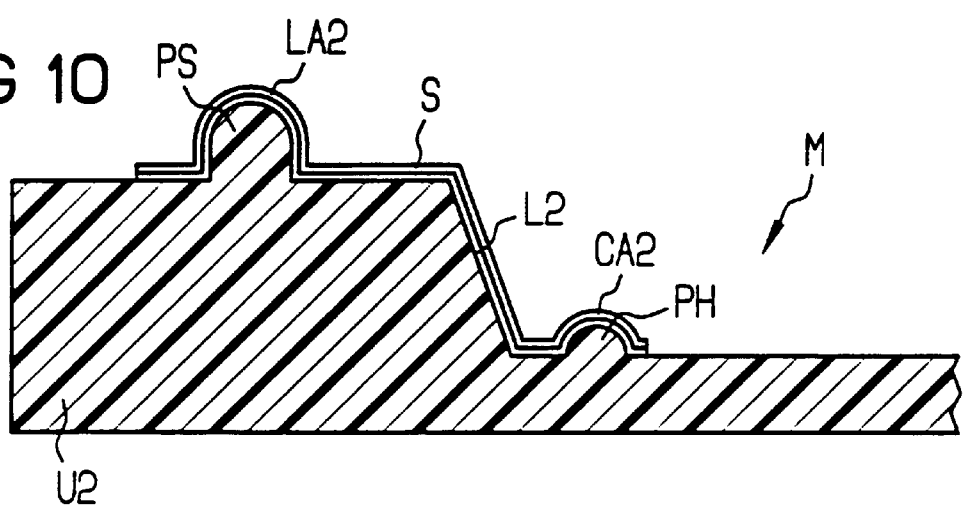
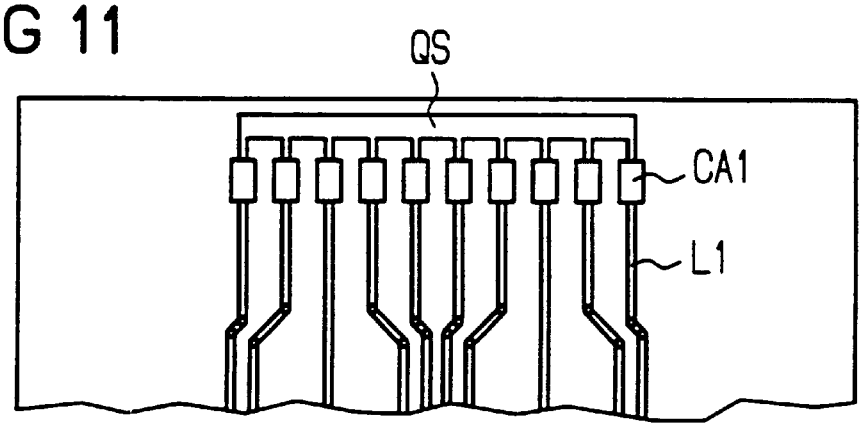

METHOD FOR FORMING METAL CONDUCTOR PATTERNS ON ELECTRICALLY INSULATING SUBSTRATES AND SUPPORTS

BACKGROUND OF THE INVENTION

U.S. Pat. No. 4,804,615 discloses a method for forming metallic conductor patterns with solderable connection regions, in which the starting point is an electrically insulating, flat substrate laminated with copper on both sides. After through-contact holes have been drilled, a copper layer, which also extends over the walls of the hole, is deposited from a chemical deposition bath. An electrolytic resist is then applied to this copper layer and covers everything except the subsequent connection regions, so that copper and a tin/lead alloy can be deposited here electrolytically one after another. The tin/lead alloy forms a final surface of the connection regions which can be soldered. After the complete removal of the electrolytic resist, an etch resist is applied and, with the exception of the connection regions, covers all the regions of the subsequent conductor pattern. After this, all those regions of the chemically deposited copper layer which do not correspond to the conductor pattern, and of the copper lamination, are etched away down to the surface of the substrate. During this etching process, it is not only the actual etch resist but also the etch-resistant final surface of the connection regions which protect the copper located beneath them from the etching attack. After the complete removal of the etch resist, a solder-stop lacquer is then applied, which covers everything except those connection regions of the conductor pattern which can be soldered.

U.S. Pat. No. 4,608,274 discloses a further method for forming metallic conductor patterns with connection regions which can be soldered, and the starting point for the method is a pre-drilled, electrically insulating, flat substrate. After the non-electrolytic deposition of copper to both sides of the substrate and in the holes, an etch resist is applied to the copper layer, and, with the exception of the subsequent connection regions, covers all the regions of the subsequent conductor pattern. An electrolytic resist is then applied, and covers everything except the subsequent connection regions, so that copper and a tin/lead alloy can be deposited electrolytically here one after another. Following the complete removal of the electrolytic resist, all the regions of the exposed copper layer are etched away, down to the surface of the substrate; and in the region of the conductor pattern, the etch resist and the etch-resistant final surface of the connection regions protect the copper layer located beneath them from the etching attack. Following the complete removal of the etch resist, a solder-stop lacquer is also applied again, and covers everything except the connection regions of the conductor pattern which can be soldered.

WO 95/29573 discloses a further method for forming metallic conductor patterns having connection regions that can be soldered and/or bonded on electrically insulating substrates. This method comprises the following method steps:

a.) Applying a metalization to the substrate;

b.) Applying an organic, electrolysis-resistant and etch-resistant protective layer to the metalization in an electrolytic dip-coating bath;

c.) Removing the protective layer in the subsequent connection regions by means of laser radiation;

d.) Electrolytically depositing an etch-resistant final surface which can be soldered and/or bonded onto those regions of the metalization exposed in method step c);

e.) Removing the protective layer, at least in the regions directly adjacent to the subsequent conductor pattern, by means of laser radiation;

f.) Etching those regions of the metalization exposed in method step e) down to the surface of the substrate.

The advantages of the method outlined above reside in particular in the fact that only a single organic protective layer has to be applied in an electrolytic dip-coating bath and, following a first structuring by means of laser radiation, serves as an electrolytic resist and, after a second structuring by means of laser radiation, serves as an etch resist, and also does not have to be removed following the formation of the conductor pattern. The protective layer previously already used as a electrolytic resist and etch resist can, if appropriate, additionally be used further as a solder-stop mask.

In WO 96/09646, a so-called Polymer Stud Grid Array (PSGA) is described which combines the advantages of a Ball Grid Array (BGA) with the advantages of MID technology. The description of the new design type as a polymer stud Grid Array (PSGA) was carried out in this case following the model of the Ball Grid Array (BGA), and the term "Polymer Stud" is intended to refer to the polymer studs formed at the same time during the injection molding of the substrate. The new design type, suitable for single-chip, few-chip or multi-chip modules, comprises an injection-molded, three-dimensional substrate made of an electrically insulating polymer, polymer studs arranged over the area of the underside of the substrate and formed at the same time during the injection molding, external connections formed on the polymer studs by a final surface that can be soldered, conductor trains, formed at least on the underside of the substrate, which connect the external connections to internal connections and at least one chip arranged on the substrate, whose connections are electrically conductively connected to the internal connection.

U.S. Pat. No. 4,289,575 discloses a method of producing printed circuits in which, firstly, a conductor pattern is produced by means of conventional photo-etching technology, and its individual conductors remain connected to one another via connecting webs. An electrically insulating, electrolysis-resistant and etch-resistant first film is subsequently applied in such a way that only the connection regions of the conductor pattern and the connecting webs remain free. After that, an electrolysis-resistant second film is applied to the connecting webs, whereupon a final surface which can be soldered and/or bonded is applied, by means of electrolytic metal deposition, to the exposed connection regions of the conductor pattern. Following the removal of the second film, the connecting webs can then be etched away selectively.

SUMMARY OF THE INVENTION

The invention is based on the problem of providing a simple and economical method for forming metallic conductor patterns having connection regions that can be soldered and/or bonded on an electrically insulating substrate read, in particular, is also suitable for the production of flexible circuits and Polymer Stud Grid Arrays (PSGA). With regard to the requirements placed on modern chip packages, it should be possible for conductor patterns having extremely fine structures to be formed on the substrate.

The basis for the solution according to the invention is fine laser structuring, which makes it possible to implement, on a processing area of, for example 5×5 cm², structures of about 40 μm conductor width and 30 μm insulation spacing, without clean-room conditions. Very dense, one-layer wiring between single-row or multiple-row chip connections, and multi-row printed circuit board connections can be implemented in this way.

Exemplary embodiments of the invention are illustrated in the drawing and will be described in:

BRIEF DESCRIPTION OF THE DRAWING

FIG. 1 to FIG. 8 show, in a very simplified schematic sectional view, various method stages in the formation of metallic conductor patterns having connection regions which can be soldered on an electrically insulating substrate, FIG. 9 shows a section through a substrate, designed as a sheet, having connection regions on opposite sides of the sheet, FIG. 10 shows a section through a Polymer Stud Grid Array with connection regions formed on integral polymer studs, FIG. 11 shows an exemplary embodiment of an electrically conductive connection between the individual conductors of a conductor pattern.

DESCRIPTION OF THE PREFERRED EMBODIMENTS

Figure 5:
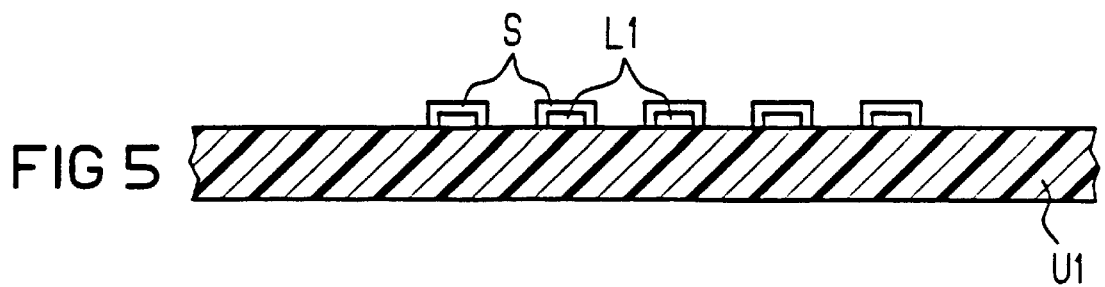

According to FIG. 1, the starting point is an electrically insulating substrate U1, which in the exemplary embodiment outlined is a thin flexible sheet.

The substrate U1 illustrated in FIG. 1 is first slightly etched to increase the adhesion of the conductor pattern which is subsequently to be applied, and is then cleaned. After cleaning, seeding (not visible in detail from the drawing) of the substrate U1 is carried out, for example by dipping in a Pd—$Cl_2$—$SnCl_2$ bath.

After the seeding has been activated, a metalization M1, which can be seen from FIG. 2, is applied over the whole area to the substrate U1, this metalization being formed by a copper layer which is deposited chemically without externally applied current. If appropriate, the metalization M1 can also be further reinforced by subsequent electrolytic copper deposition.

According to FIG. 3, the metalization M1 is removed, by means of laser radiation LS, in the regions which directly adjoin the desired conductor pattern, in such a way that the individual conductors L1 of the conductor pattern remain electrically connected to one another. The electrically conductive connection (not visible in FIG. 3) of the individual conductors L1 will be explained in more detail at a later point using FIG. 11.

According to FIG. 4, an organic, electrolysis-resistant protective layer S is then applied to the conductor pattern in an electrolytic dip-coating bath with, the electrically interconnected conductors L1 of the conductor pattern having anodic or cathodic contact made with them, depending on the type of electrolytic dip-coating bath. After application of the layer S, it can be dried.

According to FIG. 5, the protective layer S can also be used as an etch resist, all those regions of the metalization M1 which do not correspond to the conductor pattern being removed in a corresponding etching bath. Those regions of the metalization M1 which do not correspond to the conductor pattern can also remain on the substrate U1, however, and can be used later, for example as electromagnetic shielding. In the latter case, the remaining regions of the metalization M1 likewise have an anodic or cathodic contact made with them, and are covered with the protective layer S.

Figure 6:
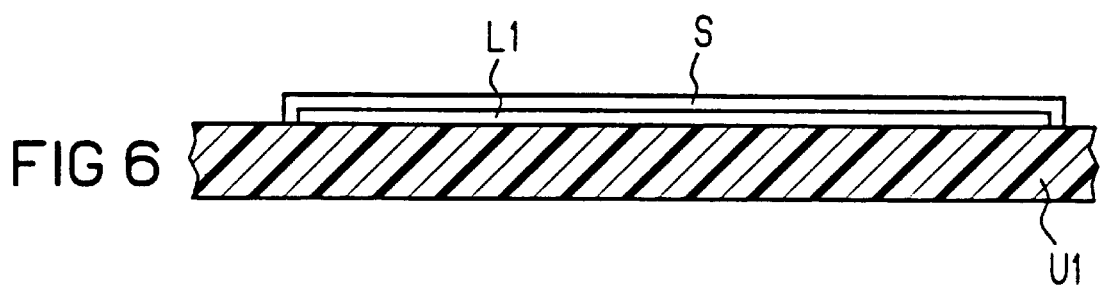

FIG. 6 shows the longitudinal extent of a conductor L1 and the protective layer S applied to it in a section through the substrate U1 rotated through 90° by comparison with FIG. 5.

Figure 7:
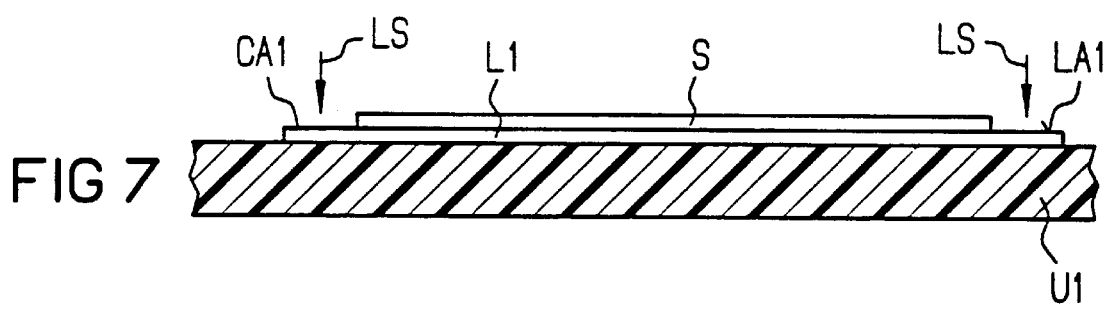

According to FIG. 7, the protective layer S is then removed again by means of laser radiation LS in the subsequent connection regions of the conductor pattern. The remaining protective layer S can be cured. In FIG. 7, it is possible to see a connection region CA1, to be used later as a chip connection, and a connection region LA1, to be used later as a printed circuit board connection.

Figure 8:
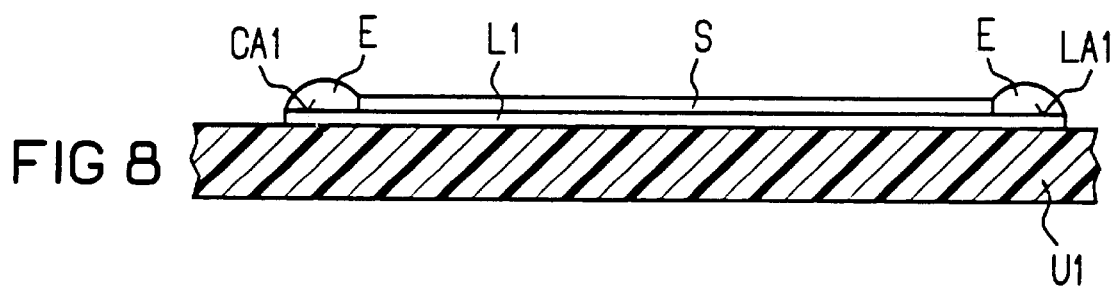

Subsequently, according to FIG. 8, a final surface material E which can be soldered is applied, by means of electrolytic metal deposition, to those regions of the conductor pattern exposed by means of laser radiation LS. In the exemplary embodiment illustrated, this final surface material E is a tin/lead alloy or either tin, gold or nickle.

FIG. 9 shows a variant in which the substrate U1, formed by a flexible sheet, is provided with through-contact holes DL in the region of the connection regions CA1 serving later as chip connections. As a result, connection regions LA1 designed as printed circuit board connections, and conductors L1 leading away from these, can be arranged on the underside of the substrate U1, while the connection regions CA1 designed as chip connections can be arranged on the upper side of the substrate U1. In this case, the connection regions CA1 designed as chip connections are built up by means of the electrolytic deposition of the final surface material E (which can be soldered) in the region of the through-contact holes DL.

FIG. 10 shows a further exemplary embodiment, in which the method steps outlined using FIGS. 1 to 8 are applied during the production of a Polymer Stud Grid Array. Here, use is made of a three-dimensional substrate U2 produced by injection-molding a thermoplastic molding compound, on the underside of which polymer studs PS arranged over the area are formed at the same time during the injection molding. Furthermore, it is possible to see that a trough M for accommodating a chip is also formed on the underside of the substrate U2 during the injection molding, and that, in the region of this trough M, polymer studs PH are likewise formed at the same time during the injection molding. The connection regions CA2 designed as chip connections are then produced on these polymer studs PH. The connection of the connection regions LA2 designed as printed circuit board connections and the connection regions CA2 designed as chip connections is carried out by means of conductors L2. The protective layer S covers all the regions of the conductor pattern which do not correspond to the connection regions LA2 and CA2.

FIG. 11 shows an example of the electrically conductive connection of the conductors L1 of the conductor pattern. The connection is made here by means of a transverse web QS, which interconnects all the connection regions CA1 designed as chip connections. This transverse web QS then has anodic or cathodic contact made with it, depending on the type of bath, during the application of the protective layer S in an electrolytic dip-coating bath. Following the electrolytic deposition of the final surface, the transverse web can be severed, for example by means of stamping. A further simple and economic possibility is to sever the transverse web QS from the associated connection regions by means of laser radiation.

Figure 12:
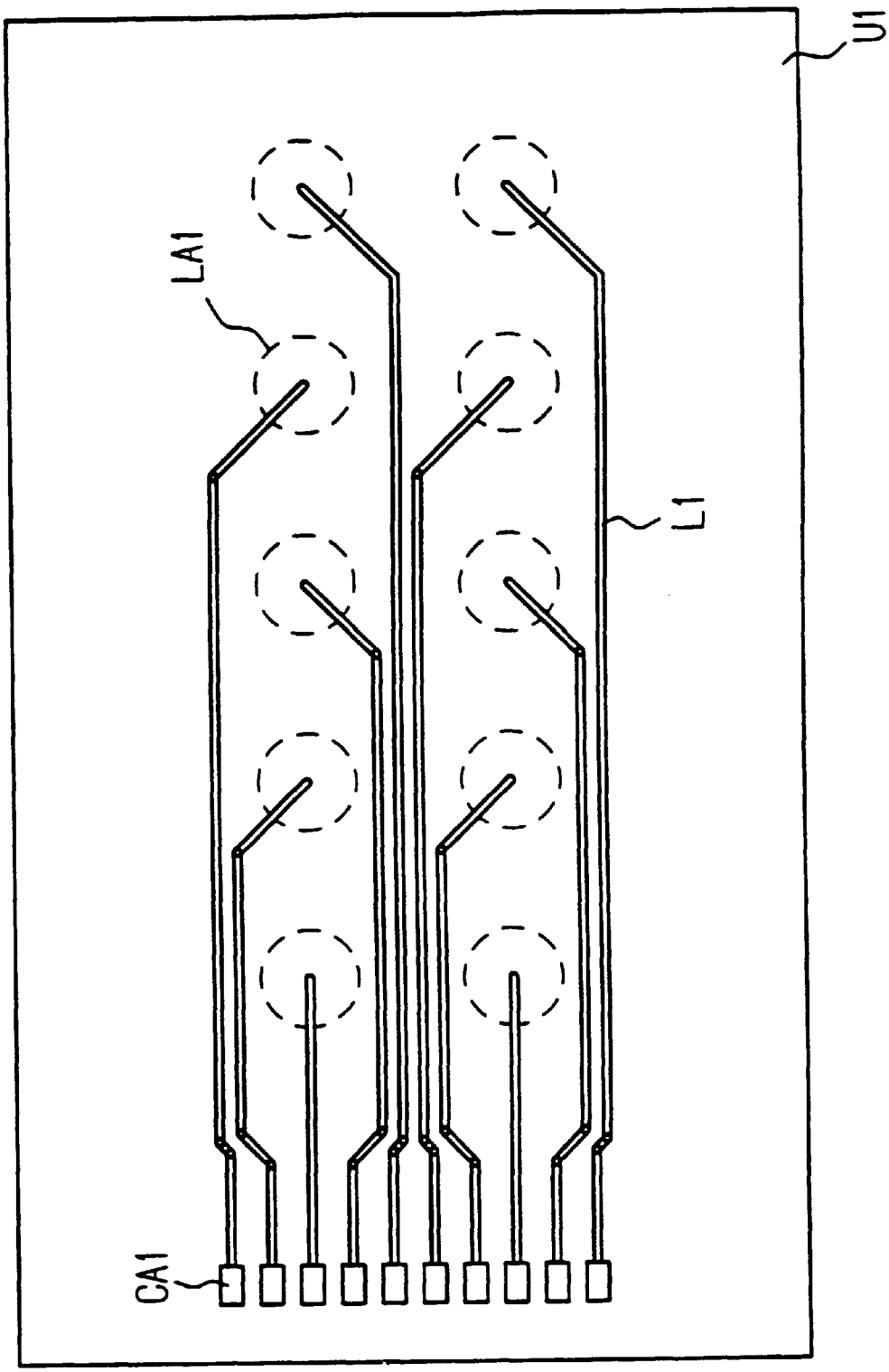
FIG. 12 shows a first exemplary embodiment of a flexible circuit with chip connections arranged on one side.

FIG. 12 shows a first exemplary embodiment of a flexible circuit, in which the connection regions CA1 designed as chip connections and the conductors L1 are formed on one side of the substrate U1. The connection regions CA1 designed as chip connections are in this case arranged in a row in the edge region of the substrate U1. The connection regions LA1 designed as printed circuit board connections are arranged in two rows on the opposite side of the substrate U1. The production of these printed circuit board connections is carried out following the model of the procedure described in conjunction with FIG. 9 in the region of through-contact holes, but these are not specifically illustrated in FIG. 12.

Figure 13:
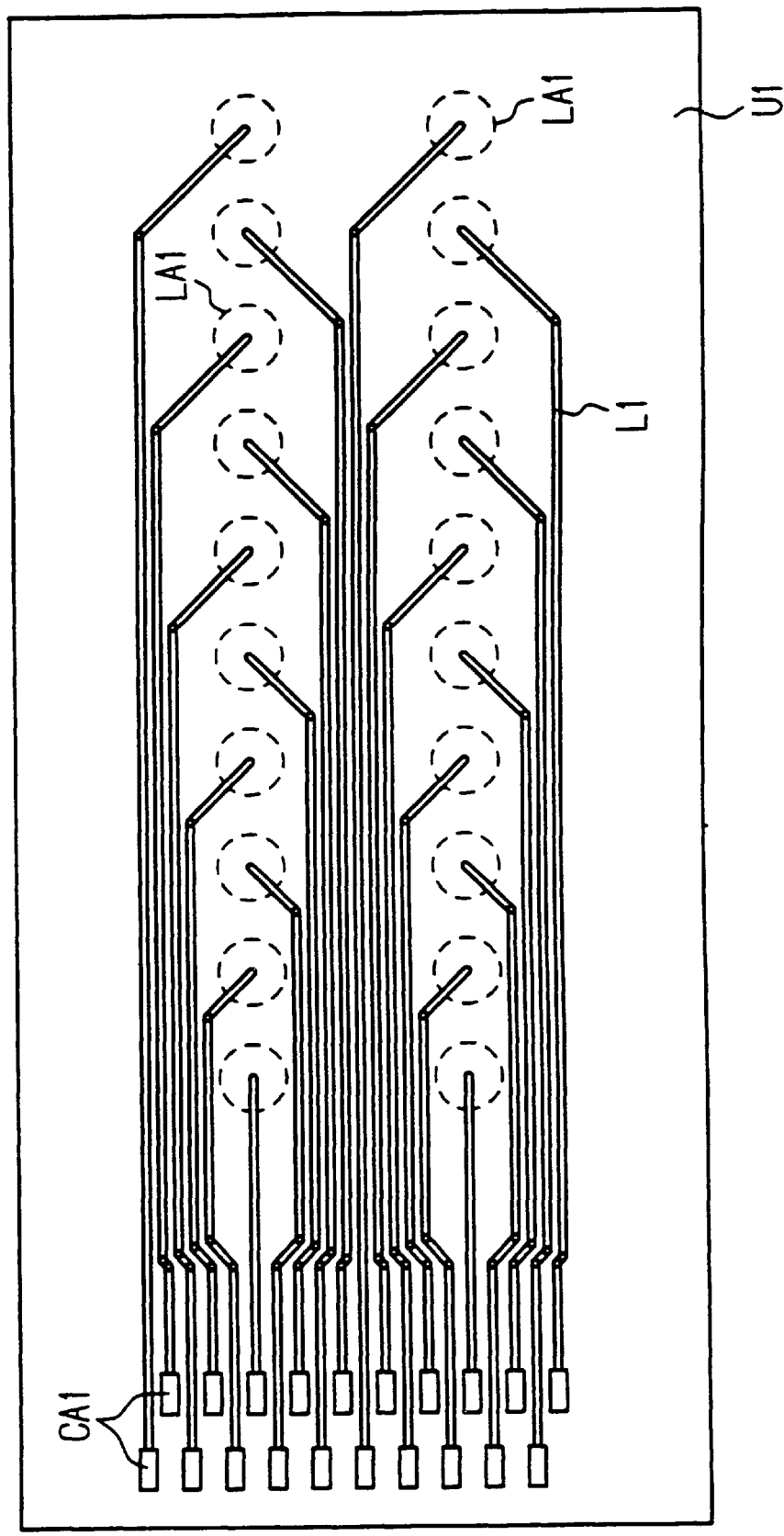
FIG. 13 shows a second exemplary embodiment of a flexible circuit with chip connections arranged in two rows.

FIG. 13 shows a second exemplary embodiment of a flexible circuit in which, as distinct from the embodiment according to FIG. 12, two rows of connection regions CA1 designed as chip connections are provided, arranged so as to be offset from one another. This offset arrangement of the connection regions in two rows means that particularly low insulation spacings can be implemented between the individual conductors L1.

What is claimed is:

1. A method for forming metallic conductor patterns having connection regions, that can be soldered and/or bonded, on electrically insulating substrates, the method having the following steps:

applying a metalization to the substrate;

removing the metalization by means of fine laser structuring, at least in those regions directly adjacent to the desired conductor pattern to form a conductor pattern with individual conductors of the conductor pattern, said conductors being electrically connected to one another by a conductive connection;

then applying an organic, electrolysis-resistant protective layer to the conductor pattern in an electrolytic dip-coating bath;

removing the protective layer in the subsequent connection regions of the individual conductors by laser structuring; and electrolytically depositing a final surface material that can be soldered and/or bonded to those regions of the metalization exposed by the step of removing the protective layer.

2. The method as claimed in claim 1, wherein a flexible sheet is used as the substrate.

3. The method as claimed in claim 2, wherein connection regions designed as printed circuit board connections and conductor tracks leading away from these are arranged on the underside of the substrate, and connection regions designed as chip connections are arranged on the upper side of the substrate, said method including a step of forming a through-contact hole for each chip connection to form exposed portions of the conductor tracks, the connection regions designed as chip connections being built up by means of the electrolytic deposition of the final surface material, which can be soldered and/or bonded on exposed portions of the connector tracks, in the region of through-contact holes.

4. The method as claimed in claim 1, which includes providing a three-dimensional substrate produced by injection-molding a thermoplastic molding compound.

5. The method as claimed in claim 4, polymer studs arranged over the area are formed on the underside of the substrate at the same time during the injection molding, and wherein connecting regions designed as printed circuit board connections are produced on the polymer studs.

6. The method as claimed in claim 5, characterized in that a trough for accommodating a chip is formed on the underside of the substrate during the injection molding, and wherein the polymer studs are arranged outside the trough region.

7. The method as claimed in claim 6, characterized in that polymer studs are formed at the same time in the region of the trough during the injection molding, and wherein connection regions designed as chip connections are produced on said additional polymer stubs.

8. A method according to claim 1, wherein the step of applying a metalization uses a chemical metal deposition.

9. A method according to claim 8, wherein the metal is copper.

10. A method according to claim 8, which includes reinforcing the metalization by electrolytically depositing metal on the metalization.

11. A method according to claim 10, wherein the metal is copper.

12. A method according to claim 1, wherein the fine laser structuring forms conductor tracks with a width of between 35 μm and 45 μm and an insulation spacing of between 25 μm to 35 μm.

13. A method according to claim 1, wherein the metalization is applied to the entire surface of the substrate.

14. A method according to claim 1, wherein the step of applying an organic, electrolysis-resistant protective layer applies a temperature-resistant lacquer.

15. A method according to claim 14, which includes a step of drying the protective layer after being applied.

16. A method according to claim 14, which includes curing the remaining protective layer after the step of removing the protective layer in the connection regions.

17. A method according to claim 1, wherein the final surface material is selected from tin and a tin/lead alloy.

18. A method according to claim 1, wherein the first surface material is selected from nickel and gold.

19. A method according to claim 3, which includes a step of removing the conductive connection after the steps of depositing the first surface material.

20. A method according to claim 1, which includes removing the conductive connection after the step of electrolytically depositing a final surface material.

* * * * *